United States Patent
Guillemenet et al.

(10) Patent No.: US 9,224,463 B2
(45) Date of Patent: Dec. 29, 2015

(54) COMPACT VOLATILE/NON-VOLATILE MEMORY CELL

(75) Inventors: Yoann Guillemenet, Crest (FR); Lionel Torres, Combaillaux (FR)

(73) Assignees: Centre National de la Recherche Scientifique (FR); Université Montpellier 2 (FR)

( * ) Notice: Subject to any disclaimer, the term of this patent is extended or adjusted under 35 U.S.C. 154(b) by 101 days.

(21) Appl. No.: 13/980,529

(22) PCT Filed: Jan. 19, 2012

(86) PCT No.: PCT/EP2012/050800
§ 371 (c)(1),
(2), (4) Date: Oct. 30, 2013

(87) PCT Pub. No.: WO2012/098197
PCT Pub. Date: Jul. 26, 2012

(65) Prior Publication Data
US 2014/0043062 A1  Feb. 13, 2014

(30) Foreign Application Priority Data
Jan. 19, 2011 (FR) ...................................... 11 50407

(51) Int. Cl.
*G11C 13/00* (2006.01)
*G11C 11/15* (2006.01)
(Continued)

(52) U.S. Cl.
CPC .............. *G11C 13/003* (2013.01); *G11C 11/15* (2013.01); *G11C 11/16* (2013.01); *G11C 11/412* (2013.01); *G11C 13/0002* (2013.01); *H03K 19/1776* (2013.01)

(58) Field of Classification Search
CPC .................. H03K 19/17736; H03K 19/17728; H03K 19/17704; G11C 11/16; G11C 11/15; G11C 19/0069; G11C 13/0004; G11C 13/0007; H01L 43/08

USPC ....................................... 326/41; 365/158, 148
See application file for complete search history.

(56) References Cited

U.S. PATENT DOCUMENTS 4,006,469 A    2/1977   Leehan et al.
5,973,965 A   10/1999   Berthold et al.
(Continued)

FOREIGN PATENT DOCUMENTS

EP    1134746 A2   9/2001
FR    2966636 A1   4/2012
(Continued)

OTHER PUBLICATIONS

Damien Czarik, "International Patent Application No. PCT/EP2012/050800 International Search Report", May 7, 2012, Publisher: EPO, Published in: EP.

(Continued)

*Primary Examiner* — Dylan White
(74) *Attorney, Agent, or Firm* — Kaplan Breyer Schwarz & Ottesen, LLP

(57) ABSTRACT

A memory device includes at least one memory cell having a first transistor coupled between a first storage node and a first supply voltage; a second transistor coupled between a second storage node and the first supply voltage and a single resistance switching element. Control terminals of the first and second transistors are coupled to the second and first storage nodes respectively. The single resistive switching element is coupled in series with the first transistor and is programmable to have one of first and second resistances. The first storage node is coupled to a first access line via a third transistor connected to said first storage node, and the second storage node is coupled to a second access line via a fourth transistor connected to the second storage node.

15 Claims, 5 Drawing Sheets

(51) Int. Cl.
 G11C 11/16 (2006.01)
 H03K 19/177 (2006.01)
 G11C 11/412 (2006.01)

(56) References Cited

U.S. PATENT DOCUMENTS

| | | | | |
|---|---|---|---|---|
| 6,172,899 | B1 * | 1/2001 | Marr et al. | 365/154 |
| 7,495,945 | B2 | 2/2009 | Roehr | |
| 7,760,538 | B1 * | 7/2010 | Paak | 365/148 |
| 7,764,081 | B1 | 7/2010 | Tuan et al. | |
| 7,796,417 | B1 * | 9/2010 | Lewis | 365/148 |
| 8,508,983 | B2 | 8/2013 | Wang et al. | |
| 8,605,490 | B2 | 12/2013 | Fackenthal | |
| 8,773,896 | B2 | 7/2014 | Shukh | |
| 2003/0161184 | A1 | 8/2003 | Lee et al. | |
| 2003/0204689 | A1 | 10/2003 | Shimoda | |
| 2004/0125643 | A1 | 7/2004 | Kang et al. | |
| 2004/0141363 | A1 | 7/2004 | Ohtsuka et al. | |
| 2006/0181916 | A1 * | 8/2006 | Roehr | 365/148 |
| 2007/0041242 | A1 | 2/2007 | Okazaki et al. | |
| 2008/0089146 | A1 | 4/2008 | Fujito et al. | |
| 2009/0109734 | A1 | 4/2009 | Hanafi | |
| 2009/0190409 | A1 | 7/2009 | Dittrich et al. | |
| 2009/0268513 | A1 | 10/2009 | De Ambroggi et al. | |
| 2010/0080042 | A1 | 4/2010 | Lamorey | |
| 2010/0188891 | A1 * | 7/2010 | Taniguchi et al. | 365/158 |
| 2010/0202191 | A1 | 8/2010 | Ahn et al. | |
| 2010/0259975 | A1 | 10/2010 | Toda | |
| 2010/0271866 | A1 * | 10/2010 | Sakimura et al. | 365/158 |
| 2011/0085372 | A1 | 4/2011 | Fackenthal | |
| 2011/0110142 | A1 * | 5/2011 | Kitagawa et al. | 365/148 |
| 2011/0122709 | A1 | 5/2011 | Kim et al. | |
| 2011/0208904 | A1 | 8/2011 | Fujito et al. | |
| 2013/0135008 | A1 * | 5/2013 | Zhang et al. | 326/41 |
| 2014/0269003 | A1 * | 9/2014 | Guillemenet et al. | 365/148 |

FOREIGN PATENT DOCUMENTS

| | | |
|---|---|---|
| FR | 2970589 A1 | 7/2012 |
| JP | 2003157671 A | 5/2003 |
| WO | 2007045202 A1 | 4/2007 |
| WO | 2008112746 A2 | 9/2008 |
| WO | 2010065691 | 6/2010 |

OTHER PUBLICATIONS

IBM, "Combined Single/Dual-Port Array Approach with 6-Device Cell", "IBM Technical Disclosure Bulletin", Jun. 1, 1988, pp. 291-292, vol. 31, No. 1, Publisher: IBM Corp., Published in: US.
Yoann Guillemenet et al, "A Non-Volatile Run-Time FPGA Using Thermally Assisted Switching MRAMS", pp. 421-426.
G. Grynkewich et al, "Nonvolatile Magnetoresistive Random-Access Memory Based on Magnetic Tunnel Junctions", Nov. 2014, pp. 818-821.
William C. Black, Jr.et al., "Programmable logic using giant-magnetoresistance and spin-dependent tunneling devices invited", May 1, 2000, pp. 6674-6679, vol. 87, No. 9, Publisher: AIP Publishing.
Zhao et al., "TAS-MRAM based Non-volatile FPGA logic circuit", Dec. 1, 2007, pp. 153-160, Publisher: International Conference on Field-Programmable Technology. ICFPT 2007. IEEE, XP031208385.
Yamamoto, et al., "Nonvolatile Static Random Access Memory Using Resistive Switching Devices: Variable-Transconductance Metal Oxide Semiconductor Field-Effect-Transistor Approach", "Japanese Journal of Applied Physics", Apr. 1, 2010, p. 40209-1, vol. 49, No. 4, Publisher: Japan Society of Applied Physics, Published in: JP.
"International Preliminary Report on Patentability," dated Jul. 23, 2013, issued in counterpart International Application No. PCT/EP2012/050800.

"International Preliminary Report on Patentability," dated Jul. 23, 2013, issued in related International Application No. PCT/EP2012/050798 (counterpart to related U.S. Appl. No. 13/980,555).
Damien Czarik, "International Search Report," dated Feb. 29, 2012, issued in related International Patent Application No. PCT/EP2012/050798 (counterpart to related U.S. Appl. No. 13/980,555).
Prenat et al., "Related U.S. Appl. No. 13/980,555", filed Nov. 22, 2013 Publisher: USPTO.
"International Preliminary Report on Patentability," dated Jul. 23, 2013, issued in related International Application No. PCT/EP2012/050772 (counterpart to related U.S. Appl. No. 13/980,558).
"International Search Report," dated Jul. 5, 2012, issued in related International Patent Application No. PCT/EP2012/050772 (counterpart to related U.S. Appl. No. 13/980,558).
Tan Nguyen, "Supplemental Notice of Allowance," dated Dec. 4, 2014, issued in related U.S. Appl. No. 13/980,558.
Guillemenet et al., "Related U.S. Appl. No. 13/980,558", filed Oct. 30, 2013 Publisher: USPTO.
Nguyen, Tan, "Notice of Allowance," dated Jan. 21, 2015, issued in related U.S. Appl. No. 13/980,558.
Nguyen, Tan, "Notice of Allowance," dated Sep. 26, 2014, issued in related U.S. Appl. No. 13/980,558.
"International Preliminary Report on Patentability," dated Jul. 23, 2013, issued in related International Application No. PCT/EP2012/050767 (counterpart to related U.S. Appl. No. 13/980,559).
"International Search Report," dated May 7, 2012, issued in related International Patent Application No. PCT/EP2012/050767 (counterpart to related U.S. Appl. No. 13/980,559).
Guillemenet et al., "Related U.S. Appl. No. 13/980,559", filed Nov. 21, 2013 Publisher: USPTO.
"International Search Report," dated Jun. 12, 2014, for French Application No. 13/57536 (counterpart to related U.S. Appl. No. 14/446,044).
"International Preliminary Report on Patentability," dated Dec. 17, 2013, issued in related International Application No. PCT/EP2012/061267 (counterpart to U.S. Appl. No. 14/126,051).
Officer: Balaguer Lopez, J, "International Search Report," dated Sep. 6, 2012, issued in related International Application No. PCT/EP2012/061267 (counterpart to U.S. Appl. No. 14/126,051).
"Notice of Allowance," dated Sep. 26, 2014, issued in related U.S. Appl. No. 14/126,051.
Guillemenet et al., "Related U.S. Appl. No. 14/126,051", filed Mar. 6, 2014 Publisher: USPTO.
"Supplemental Notice of Allowance," dated Jan. 2, 2015, issued in related U.S. Appl. No. 14/126,051.
Di Pendina et al., "U.S. Appl. No. 14/446,044," filed Jul. 29, 2014 Publisher: USPTO.
"International Preliminary Report on Patentability," datedDec. 17, 2012, issued in International Patent Application No. PCT/EP2012/061268 (counterpart to related U.S. Appl. No. 14/126,067).
Officer: Jim Lindquist, "International Search Report," datedDec. 6, 2012, issued in International Patent Application No. PCT/EP2012/061268 (counterpart to related U.S. Appl. No. 14/126,067).
Non-Final Office Action, dated Oct. 8, 2014, issued in related U.S. Appl. No. 14/126,067.
Guillemenet et al., "Related U.S. Appl. No. 14/126,067", filed Dec. 13, 2013, Publisher: USPTO.
Balaguer Lopez, J., "International Search Report," dated Nov. 13, 2014, issued in corresponding EP Application No. 14175842.5 (counterpart to related U.S. Appl. No. 14/324,110).
Balaguer Lopez, J., "International Search Report," dated Mar. 7, 2014, for French Patent Application No. 13/56637, (counterpart to related U.S. Appl. No. 14/324,110).
Di Pendina et al., "Related U.S. Appl. No. 14/324,110", filed Jul. 4, 2014 Publisher: USPTO.
Guillaume et al, "Related U.S. Appl. No. 14/395,555," filed Oct. 20, 2014 Publisher: USPTO.
Yue Zhang et al, "Compact Modeling of Perpendicular-Anisotrophy CoFeB/MgO Magnetic Tunnel Junctions", Mar. 2012, pp. 819-826, vol. 59, No. 3.
Lionel Torres et al., "Evaluation of hybrid MRAM/CMOS cells for reconfigurable computing" Published in: FR.

(56) References Cited

OTHER PUBLICATIONS

"International Search Report," dated Jul. 12, 2013, issued in International Application No. PCT/FR2013/050910 (counterpart to related U.S. Appl. No. 14/395,555).

Luqiao Liu, et al, "Magnetic switching by spin torque from the spin Hall effect", Published in: US.

Saied Tehrani, et al, "Magnetoresistive Random Access Memory Using Magnetic Tunnel Junctions", "Proceedings of the IEEE", May 2003, pp. 703-714, vol. 91, No. 5.

Ioan Mihai Miron et al, "Perpendicular switching of a single ferromagnetic layer induced by in-plane current injection", Aug. 11, 2011, pp. 189-194, vol. 476.

L. Q. Liu et al., "Spin-Torque Switching with the Giant Spin Hall Effect of Tantalum", 2012, vol. 336, No. 555.

I L Prejbeanu et al., "Thermally assisted MRAM", "Journal of Physics: Condensed Matter", Apr. 6, 2007, p. 23 Publisher: IOP Publishing, Published in: UK.

Sasikanth Manipatruni et al, "Voltage and Energy-Delay Performance of Giant Spin Hall Effect Switching for Magnetic Memory and Logic", pp. 1-16.

\* cited by examiner

COMPACT VOLATILE/NON-VOLATILE MEMORY CELL

RELATED APPLICATION

This application is a 371 of international application PCT/EP2012/050800 filed Jan. 19, 2012, which claims the benefit of foreign priority of French application 1150407 filed Jan. 19, 2011.

FIELD OF THE INVENTION

The present invention relates to a programmable volatile/non-volatile memory cell, and to a method of reading a programmable non-volatile memory cell.

BACKGROUND OF THE INVENTION

FIG. 1 illustrates a typical static random access memory (SRAM) cell 100. A first inverter is formed of an N-channel MOS (NMOS) transistor 102 and P-channel MOS (PMOS) transistor 103 coupled in series between a supply voltage $V_{DD}$ and a ground voltage. A second inverter is formed of an NMOS transistor 104 and a PMOS transistor 105 also coupled in series between the supply voltage $V_{DD}$ and the ground voltage. The gates of transistors 104 and 105 are coupled to a node 106 coupled to the drains of transistors 102 and 103, while the gates of transistors 102 and 103 are coupled to a node 108 coupled to the drains of transistors 104 and 105, such that the inverters form a latch.

The nodes 106 and 108 store complementary voltage states Q and $\overline{Q}$, permitting one bit of data to be memorized by the cell. Node 106 is coupled to a bit line BL via a P-channel MOS (PMOS) transistor 110, while node 108 is coupled to a complementary bit line BLB via a PMOS transistor 112. The gates of transistors 110 and 112 are coupled to a word line WL, and are activated by a low signal allowing data to be written to or read from the cell 100.

The circuit 100 has advantage of being relatively quick to access during read and write operations. However, a disadvantage is that, as with all volatile memory cells, the stored data is lost if the supply voltage $V_{DD}$ is removed.

Flash memory is an example of a programmable non-volatile memory. A disadvantage with flash memory is that it is relatively slow to access when compared to the SRAM cell of FIG. 1, and requires a relatively high supply voltage. Furthermore, the Flash technology is difficult to integrate with CMOS, and has relatively low endurance.

In many applications there is a need for a compact programmable memory cell capable of storing non-volatile data, and having increased access speeds.

SUMMARY OF THE INVENTION

It is an aim of embodiments of the present invention to at least partially address one or more needs in the prior art.

According to one aspect of the present invention, there is provided a memory device comprising at least one memory cell comprising: a first transistor coupled between a first storage node and a first supply voltage; a second transistor coupled between a second storage node and said first supply voltage, a control terminal of said first transistor being coupled to said second storage node, and a control terminal of said second transistor being coupled to said first storage node; and a single resistance switching element, wherein said single resistive switching element is coupled in series with said first transistor and is programmable to have one of first and second resistances, wherein said first storage node is coupled to a first access line via a third transistor connected for example to said first storage node, and said second storage node is coupled to a second access line via a fourth transistor connected for example to said second storage node.

According to one embodiment, the single resistance switching element is coupled between said first transistor and said first supply voltage, a first branch of said memory cell comprising said element and said first transistor, and a second branch of said memory cell comprising said second transistor.

According to another embodiment, the single resistance switching element is coupled between said third transistor and said first access line, a first branch of said memory cell comprising said element and said third transistor, and a second branch of said memory cell comprising said fourth transistor.

According to another embodiment, the third and fourth transistors are adapted to have a lower threshold voltage than said first and second transistors.

According to another embodiment, the second branch is adapted to have, when said transistor of said second branch is activated, a resistance $R_2$ such that: $R_{ON1}+R_{min}<R_2<R_{ON1}+R_{max}$, where $R_{ON1}$ is the ON resistance of said transistor of said first branch, and $R_{min}$ and $R_{max}$ are said first and second resistances respectively.

According to another embodiment, the second branch is adapted to have a resistance R2 such that: $R_2=R_{ON1}+(R_{min}+R_{max})/2$.

According to another embodiment, the transistor of said second branch is adapted to have a different ON resistance from said transistor of said first branch.

According to another embodiment, the second branch comprises a fixed value resistor coupled in series with said transistor of said second branch.

According to another embodiment, the memory cell further comprises control circuitry adapted to store a data value at said first and second storage nodes by coupling said first and second storage nodes to a second supply voltage, and isolating said first and second storage nodes from said first supply voltage after a time delay, the data value being determined by the relative resistances of the first and second branches.

According to another embodiment, the single resistance switching element is one of an oxide resistive element; a conductive bridging element; a phase change element; a programmable metallization element; a spin-torque-transfer element; and a field-induced magnetic switching element.

According to another embodiment, the single resistance switching element is a thermally assisted switching element, and wherein said at least one memory cells further comprises a single transistor controllable to heat said single resistance switching element by passing a current through it.

According to another embodiment, the first transistor is the only transistor of a first inverter of the at least one memory cell, and the second transistor is the only transistor of a second inverter of the at least one memory cell.

According to another aspect of the present invention, there is provided a random access memory comprising an array of the above memory devices.

According to another aspect of the present invention, there is provided a field programmable gate array comprising at least one multiplexer comprising an input coupled to at least one of the above memory devices.

According to another aspect of the present invention, there is provided a field programmable gate array comprising: a plurality of configurable logic blocks; and at least one switching block adapted to interconnect said plurality of configurable logic blocks, wherein said at least one switching block comprises the above memory device.

According to another aspect of the present invention, there is provided a method of transferring a data value from non-volatile storage to first and second volatile storage nodes of the above memory cell in which a first branch comprises said element and said first transistor and a second branch comprises said second transistor, the method comprising: coupling said first and second storage nodes to a first supply voltage, the data value being determined by the relative resistances of the first and second branches.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

Throughout the figures, like features have been labelled with like reference numerals.

DETAILED DESCRIPTION OF EMBODIMENTS OF THE PRESENT INVENTION

Only those features useful for an understanding of the invention have been illustrated in the figures and will be described in detail in the following. Other aspects, such as the particular applications of the memory cell, have not been described in detail, the memory cell being suitable for use in a wide range of applications.

Figure 2:
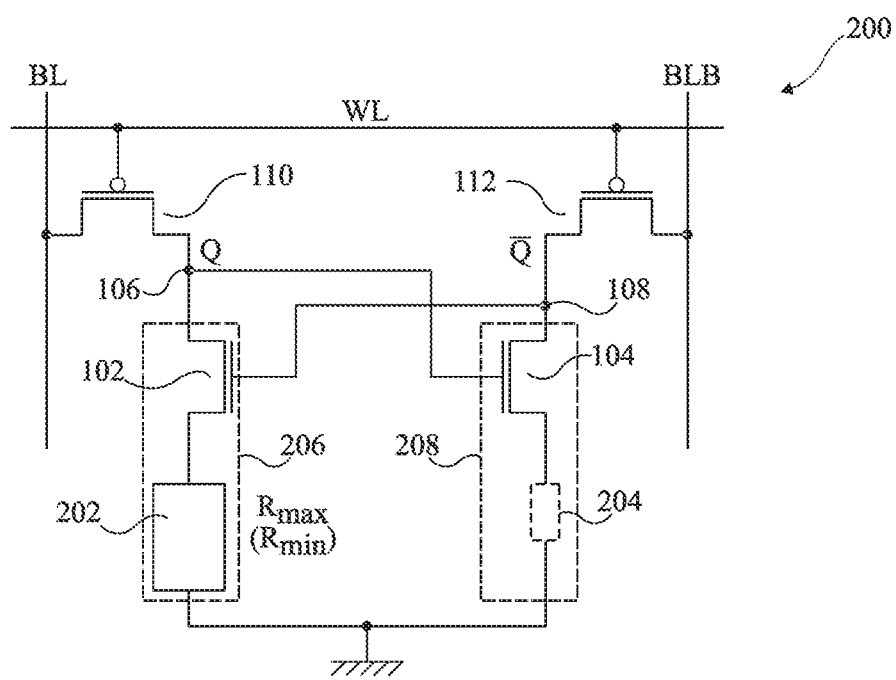
FIG. 2 illustrates a memory cell with non-volatile data storage according to an embodiment of the present invention.

FIG. 2 illustrates a memory cell 200 that stores, in addition to one bit of volatile data, one bit of non-volatile data. The volatile data is stored in electronic form by a latch. The non-volatile data however is stored by the physical state of a resistance switching element, as described below.

Figure 1:
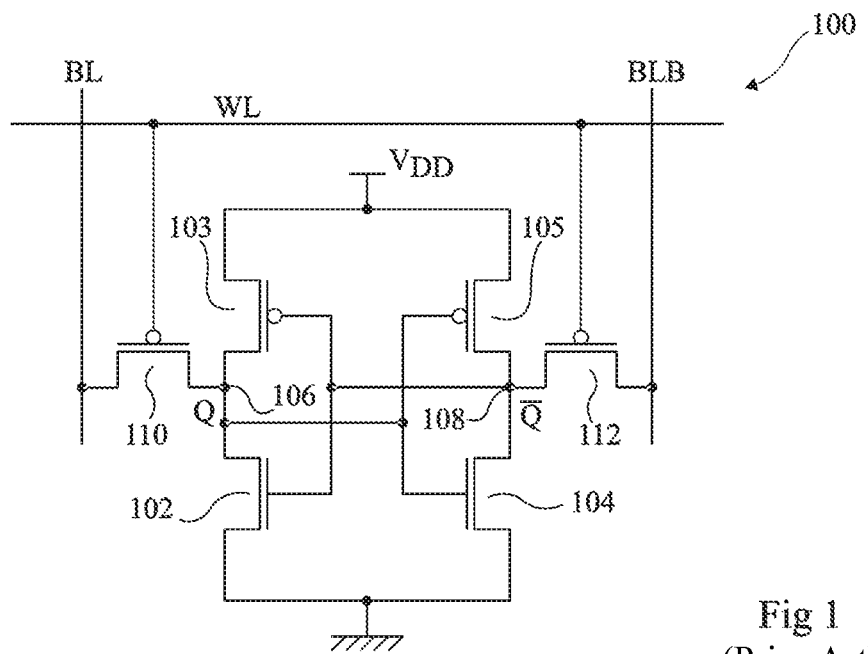
FIG. 1 (described above) illustrates a volatile SRAM cell.

The memory cell 200 is similar to the SRAM cell 100 of FIG. 1 described above, and the common portions will not be described again in detail. However, rather than comprising six transistors, the memory cell 200 comprises just four transistors. Indeed, the PMOS transistors 103 and 105 forming half of each inverter are removed, and thus there is no connection to the supply voltage $V_{DD}$ in memory cell 200. Furthermore, the memory cell 200 additionally comprises a resistance switching element 202, coupled between the source of transistor 102 and the ground voltage. Optionally, a resistor 204 is also coupled between the source of transistor 104 and the ground voltage. Element 202 and transistor 102 form a current branch 206 of the memory cell 200, while optional resistor 204 and transistor 104 form a current branch 208 of the memory cell.

The resistance switching element 202 is any resistive element switchable between two resistance values. Such elements maintain the programmed resistive state even after a supply voltage is removed.

For example, the resistance switching element 202 is based on a magnetic tunneling junction (MTJ), such as a field-induced magnetic switching (FIMS) element, thermally assisted switching (TAS) element, STT (spin-torque-transfer) element, or the element of a Toggle MRAM. FIMS-MRAM (magnetic random access memory) are for example discussed in more detail in the publication titled "Magnetoresistive random access memory using magnetic tunnel junctions", S. Tehrani, Proceedings of IEEE, 91(5):3707-714, May 2003. TAS-MRAM are for example discussed in more detail in the publication titled "Thermally Assisted MRAM", Prejbeanu et al.

Alternatively, the resistance switching element 202 could be another type of resistance switching memory device, including the one used in programmable metallization cells (PMC), such as oxide resistive RAM (OxRRAM), conductive bridging RAM (CBRAM), or phase change RAM (PCRAM), or any similar resistance switching element.

Whatever the type of resistance switching element, information is stored by setting the element 202 at either a relatively high resistance ($R_{max}$) or a relatively low resistance ($R_{min}$). The resistance switching element 202 for example has just two resistive states corresponding to the high and low resistances $R_{max}$ and $R_{min}$, although the exact values of $R_{min}$ and $R_{max}$ may vary depending on conditions such as temperature, process variations etc.

In the SRAM cell 100 of FIG. 1, transistors 103 and 105 are coupled to the supply rail $V_{DD}$ and perform the role of maintaining the high state of Q or $\overline{Q}$ at node 106 or 108 when the cell is in standby between write and read operations. In the cell 200 of FIG. 2, in which these transistors have been removed, the high state of Q or $\overline{Q}$ is maintained by leakage current passing through the PMOS transistor 110 or 112, from the corresponding bit line BL or BLB. For example, the bit lines BL and BLB are charged to the supply voltage $V_{DD}$ at least periodically during the standby state, to generate the leakage current.

The threshold voltages of the PMOS transistors 110, 112 are lower than those of NMOS transistors 102, 104, such that when in the non-conducting state, the current leakage through transistors 110 and 112 is greater than through transistor 102 or 104, thereby keeping the corresponding node 106 or 108 at a voltage high enough to be seen as a high logic level. In other words, the leakage current $I_{offP}$ flowing through PMOS transistor 110 or 112 when a high voltage is applied to its gate node is greater that the leakage current $I_{offN}$ flowing through the corresponding NMOS transistor 102 or 104 when a low voltage is applied to its gate node. The particular threshold voltages will depend on the technology used, but as an example, the threshold voltages of PMOS transistors 110, 112 are chosen to be in the range 0.3 to 0.5 V, while the threshold voltages of NMOS transistors 102, 104 are chosen to be in the range 0.4 to 0.6 V. In any case, the ratio $I_{Off}/I_{Off\!n}$ is selected for example to be greater than 25, and preferably greater than 100.

In operation, for reading and writing data to the volatile portion of the memory cell 200, in other words to the storage nodes 106 and 108, the process is the same as for the memory cell 100, and is not affected by the programmed resistance value of the resistance switching element 202. Briefly, writing a bit of data to nodes 106, 108 involves applying, while transistors 110 and 112 are turned on, a high or low voltage to bit line BL depending on the data to be stored, and the opposite voltage to bit line BLB. Reading the data from nodes 106 and 108 involves pre-charging the bit lines BL and BLB, and then turning on transistors 110 and 112 and determining which bit line voltage drops first, with the aid of a sense amplifier (not illustrated), which amplifies the voltage difference between the bit lines. Preferably, so as not to slow the read and write operations to the volatile storage nodes and to prevent a bit-flip during a read operation, the value of $R_{max}$ is chosen not to be greater than around 5 k ohms, although this value will depend on the particular technology used, and in particular the ON resistance of the transistors.

Independently of this normal SRAM operation, the resistance switching element may be programmed to store non-volatile data, and the memory cell may be controlled to transfer this data, from physical storage determined by the resistive state of element 202, to electronic storage determined by the voltage states Q and $\overline{Q}$ of the storage nodes 106, 108. Once transferred, this data may be read from the SRAM cell in a standard fashion.

During such a transfer of data from the non-volatile data storage provided by element 202, to the volatile storage nodes 106, 108, each of the storage nodes 106, 108 is coupled to the supply voltage via the bit lines BL and BLB respectively. This generates a current through each branch 206, 208, and depending on the programmed state of element 202, the resulting voltage Q at storage node 106 is greater or less than the voltage $\overline{Q}$ at storage node 108. Then, when storage nodes 106, 108 are disconnected from bit lines BL and BLB, the voltages Q and $\overline{Q}$ go to closest stable state, which will thus be determined by the resistance of element 202.

Accordingly, the resistance values $R_{min}$ and $R_{max}$ of element 202, the ON resistances of transistors 102, 104 and the resistance of the optional resistor 204, are chosen such that, when $R_{min}$ is selected and nodes 106, 108 are coupled to the supply voltage, the voltage Q is less than voltage $\overline{Q}$. Conversely, when $R_{max}$ is selected and nodes 106, 108 are coupled to the supply voltage, the voltage Q is greater than voltage $\overline{Q}$.

This can be formulated as the following condition:

$$R_{ON1}+R_{min}<R_2<R_{ON1}+R_{max}$$

where $R_{ON1}$ is the ON resistance of transistor 102, and $R_2$ is the resistance of the branch 208 when transistor 104 is ON.

In the case that resistor 204 is present in branch 208, the ON resistances of transistors 102, 104 are for example equal. In the case that resistor 204 is not present in branch 208, in other words branch 208 comprises only the transistor 104, then the resistance $R_2$ of branch 208 when transistor 104 is activated is substantially equal to the ON resistance $R_{ON2}$ of transistor 104. Thus in this case the ON resistances $R_{ON1}$, $R_{ON2}$ of transistors 102, 104 respectively are not equal, and the dimensions of transistor 104 are chosen such the above condition is met.

Preferably, in order to ensure that the voltage Q is far from the voltage $\overline{Q}$ for both values $R_{min}$ and $R_{max}$ of element 202, these resistances and the ON resistances of transistors 102, 104 and the resistance of optional resistor 204 are chosen such that:

$$R_2=R_{ON1}+(R_{min}+R_{max})/2$$

As an example, assuming resistor 204 is present, this resistor 204 has a resistance of around 3 k ohms, while $R_{min}$ is around 2 k ohms and $R_{max}$ is around 4 k ohms. Alternatively, assuming that resistor 204 is not present, for example the resistance $R_{ON1}$ of transistor 102 is around 100 ohms, the resistance $R_{ON2}$ of transistor 104 is around 1 k ohms, $R_{min}$ is around 400 ohms, and $R_{max}$ is around 1.5 k ohms. In general, the ratio between the resistance $R_{max}$ and the resistance $R_{min}$ is for example between 1.7 and 5 for an MRAM, or more generally between 1.2 and 10000, depending on the technology used.

Programming of the resistance switching element 202 according to one example will now be described with reference to FIGS. 3, 4 and 5.

Figure 3:
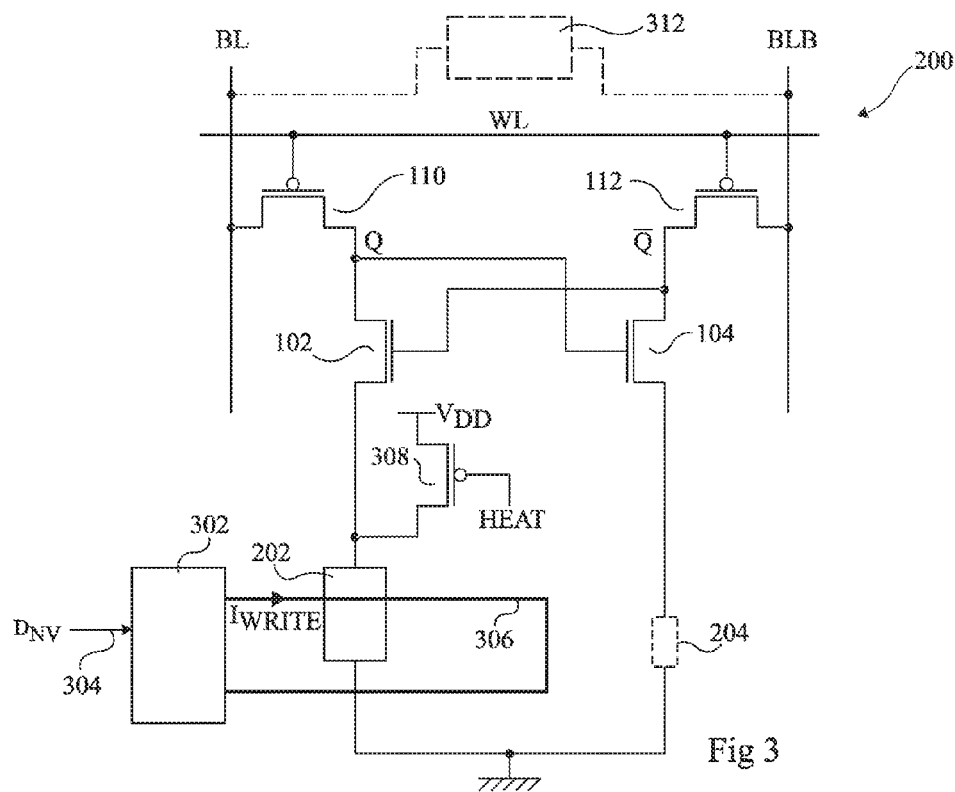
FIG. 3 illustrates programming circuitry for programming the non-volatile portion of the memory cell of FIG. 2.

FIG. 3 illustrates the memory cell 200 along with write control circuitry 302 arranged to program the resistance switching element 202 based on one bit of non-volatile data $D_{NV}$ received on an input line 304. In particular, based on the non-volatile data $D_{NV}$, the circuitry 302 generates a write current $I_{WRITE}$ of one polarity or of the opposite polarity on a conductive track 306 that passes by the resistance switching element 202. The current $I_{WRITE}$ flowing through the conductive track 306 generates a magnetic field, which passes through the resistance switching element 202 and programs its resistive state.

In the case of thermally assisted switching MRAM, prior to supplying the write current, the resistance switching element 202 is heated by passing a current through it, which aids the transition from one resistive state to another.

According to one example illustrated in FIG. 3, a PMOS transistor 308 is coupled between the supply voltage $V_{DD}$ and the resistance switching element 202. Transistor 308 is activated by a control signal "HEAT" at its gate terminal to conduct a current that passes through the resistance switching element 202.

Alternatively or additionally, heat control circuitry 312 is for example provided, which applies to each of the bit lines BL and BLB a voltage, for example equal to or greater than the supply voltage $V_{DD}$. Then, by activating the transistors 110 and 112, a heating current will flow from the bit lines BL and BLB through transistors 102, 104 and through resistance switching element 202.

Figure 4:
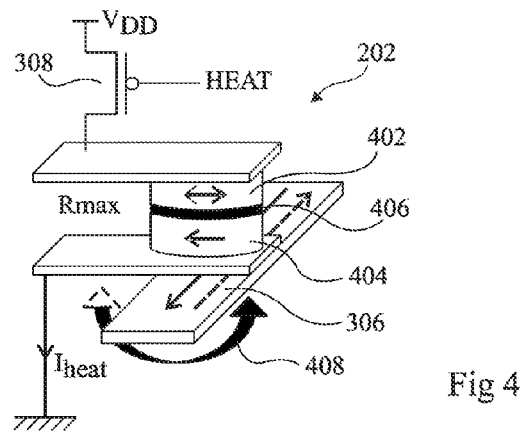
FIG. 4 schematically represents an example of the programming of a specific resistance switching memory device.

FIG. 4 shows the resistance switching element 202 in more detail in the example that it is a TAS element. It comprises a pinned ferromagnetic plate 402 and a free ferromagnetic plate 404, plates 402 and 404 sandwiching a tunnel oxide layer 406. The conductive track 306 passes close to the free plate 404 of ferromagnetic material, such that it is affected by the magnetic field 408 generated by the current $I_{WRITE}$ flowing through track 306. The pinned plate 402 for example has a magnetic orientation in a first direction, while the magnetic orientation of plate 404 may be programmed, by the polarity of the current $I_{WRITE}$, to be in the same or opposite direction to that of plate 402. However, programming only occurs in an element that has already been heated.

FIG. 4 shows, with solid arrows, the polarity of the current $I_{WRITE}$, the direction of the resulting magnetic field 408, and the programmed magnetic orientation of plate 402, in the case in which the magnetic orientations are in opposite directions in the plates 402, 404. This results in a maximum resistance $R_{max}$ of the resistance switching element 202, for example in the range 1 k to 5 k Ohms.

FIG. 4 also shows, with dashed arrows, the polarity of the current $I_{WRITE}$, the direction of the resulting magnetic field 408, and the programmed magnetic orientation of plate 402, in the case in which the magnetic orientations are in a same direction in the plates 402 and 404. This results in a minimum resistance $R_{min}$ of the resistance switching element 202, for example in the range of 100 to 3 k Ohms.

Figure 5:
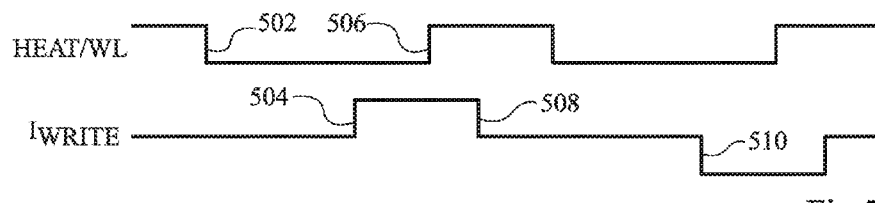
FIG. 5 is a timing diagram illustrating an example of the signals used for programming the non-volatile portion of the memory cell of FIG. 3.

FIG. 5 is a timing diagram illustrating an example of the signals HEAT and/or WL, depending on whether the transistor 308 and/or circuitry 312 is present, and the signal $I_{WRITE}$ during the programming of element 202.

The signals HEAT and/or WL fall low at falling edge 502, thereby activating transistor 308 and/or the transistors 110 and 112. This generates a current $I_{HEAT}$ through the resistance switching element 202, and after a certain period, the signal $I_{WRITE}$ is asserted, as shown by the rising edge 504 of this signal. In the example of FIG. 5, at rising edge 504 the current becomes positive, which for example programs resistor 202 to be at a high resistance value $R_{max}$, and resistor 204 to be at low resistance $R_{min}$.

Next, the signals HEAT and/or WL are brought high again by rising edge 506, such that the heating current $I_{HEAT}$ is stopped, and the resistance switching element 202 cools in its current resistive state. Then the signal $I_{WRITE}$ is brought low by a falling edge 508, to end the programming process.

The subsequent transitions of the signals in FIG. 5 correspond to the programming of an opposite resistive state $R_{min}$ of element 202. These transitions are identical to those previously described, except that the signal $I_{WRITE}$ becomes negative by falling edge 510, rather than positive, to program the resistive state $R_{min}$.

In one example, the time during which the signals HEAT and/or WL are active between edges 502 and 506 is around 20 ns. Thus a write operation can be achieved in little more than 35 ns. However, the heating and cooling-off times will vary based on factors such as the materials used, their volumes, etc., and also the heat currents that are applied, and thus the above values are given only as approximate examples.

The current $I_{WRITE}$ is for example in the region of 10 mA for programming one value of the data bit, or in the region of −10 mA for programming the opposite value of the data bit, although other values could be used.

Figure 6:
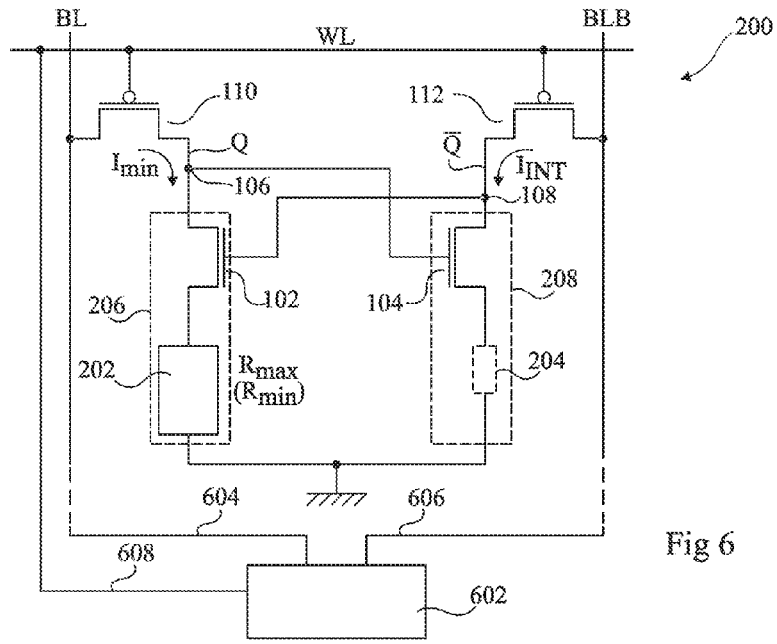
FIG. 6 illustrates an example of control circuitry for copying data stored by a non-volatile data storage element to volatile data storage of the memory cell.

FIG. 6 illustrates the memory cell 200 along with transfer control circuitry 602, for controlling the transfer of data stored in the non-volatile portion of the memory cell to the volatile data storage portion. In particular, the circuitry 602 comprises output lines 604 and 606 coupled to bit lines BL and BLB respectively, and an output line 608 coupled to the word line WL. As mentioned above, during such a transfer phase, the supply voltage is applied to each of the storage nodes 106, 108, via the bit lines BL and BLB, under control of circuitry 602.

The signals on the word line WL and bit lines BL, BLB during a non-volatile to volatile transfer phase will now be described with reference to FIGS. 7A and 7B.

Figures 7A, 7B:
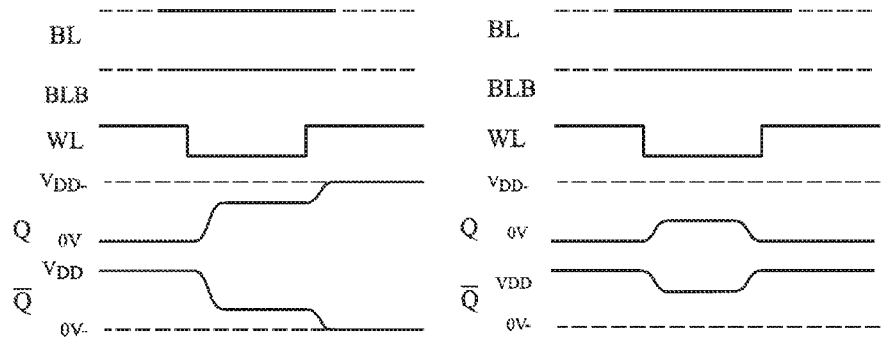
FIGS. 7A and 7B are timing diagrams showing examples of signals in the circuitry of FIG. 6.

FIG. 7A shows timing diagrams illustrating the voltages on the bit lines BL and BLB, as well as on the word line WL, and the corresponding voltages Q and $\overline{Q}$ at the storage nodes 106 and 108.

Initially, the circuitry 602 applies a high voltage to each of the bit lines BL, BLB, for example at the supply voltage $V_{DD}$. The bit lines BL and BLB are likely to be close to or at the supply voltage $V_{DD}$ during a standby or read phase prior to the transfer phase, but during such phases they are generally only periodically charged to the supply voltage, and for this reason the voltages of BL and BLB prior to and after the transfer phase are indicated by dashed lines in FIG. 7A. On the contrary, during the transfer phase, the supply voltage is constantly applied to the bit lines BL, BLB, as indicated by solid lines in FIG. 7A, such that currents may be drawn from the bit lines BL, BLB.

Then, the word line voltage WL is brought low, to activate the transistors 110 and 112.

FIG. 7A assumes that the SRAM cell is initially in a state in which Q is low and $\overline{Q}$ is high. Thus initially, transistor 104 will be non-conducting, and transistor 102 conducting. However, it is also assumed that resistance switching element 202 has a resistance $R_{max}$, and thus the current flowing through it will be limited. This current causes the voltage Q to rise towards $V_{DD}$, which in turn activates transistor 104, causing a second current to flow through transistor 104. This will reduce the voltage $\overline{Q}$ towards 0 V. Thus, due to the difference in the resistances of the branches 206, 208, the equilibrium position will be that the voltage Q at node 106 is closer to $V_{DD}$, and the voltage $\overline{Q}$ at node 108 will be closer to 0 V. Then, the word line voltage goes high, isolating the storage elements 106, 108 from bit lines BL and BLB, and the states of Q and $\overline{Q}$ will settle to the closest stable state. In particular, due to the voltage difference, even if small, between the voltages Q and $\overline{Q}$, the storage nodes 106, 108 will settle to a state in which Q is high and $\overline{Q}$ is low, which corresponds to the state stored by the element 202.

FIG. 7B illustrates the case in which Q and $\overline{Q}$ are again initially equal to 0 V and $V_{DD}$ respectively, but in which element 202 is at $R_{min}$. In this case, transistor 102 will initially still be conducting, and transistor 104 non-conducting, but again the voltage at node 106 will rise due to the current flowing through the resistance switching element 202. However, when the current through branch 208 starts to rise, it will be a lower current than the one in branch 206, and thus the voltage $\overline{Q}$ will stay relatively high, and the voltage Q relatively low. Then, when the word line voltage WL is brought high again, isolating the storage nodes 106, 108 from the respective bit lines, the states of storage nodes 106, 108 will settle back to their original states, in which Q is low and $\overline{Q}$ is high.

In both FIGS. 7A and 7B, the duration that the supply voltage is applied to the bit lines BL and BLB is for example in the region of 1 ns, and thus such a data transfer from the non-volatile storage to the volatile storage can be performed in approximately only 1 ns, a time comparable to the read and write times of the SRAM portion of the memory cell 200.

Figure 7C:
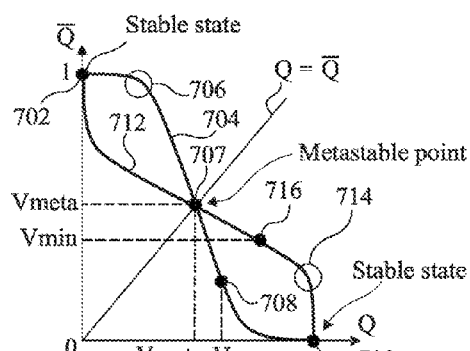
FIGS. 7C and 7D are graphs illustrating the transition between stable states of the cell of FIG. 6 according to one example.
Figure 7D:
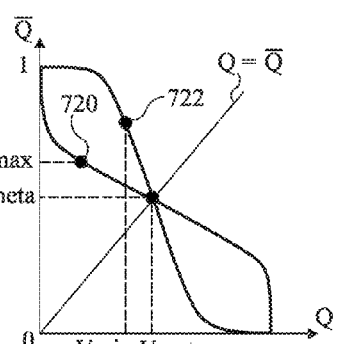

FIGS. 7C and 7D are graphs illustrating the transitions between different states of Q and $\overline{Q}$.

FIG. 7C illustrates the case of a transition to a high Q, low $\overline{Q}$ state. If starting from the low Q, high $\overline{Q}$ state labelled 702, as Q starts to rise, the curve 704 will be followed, in which initially $\overline{Q}$ falls slowly until a corner 706 is reached and transistor 104 starts to turn on. Then $\overline{Q}$ falls more quickly as Q rises and a point of metastability 707 is passed, at which point Q and $\overline{Q}$ are equal. Q will then reach a voltage Vmax at a point 708, resulting from the relatively large voltage drop across resistance $R_{max}$ and transistor 102. From this point 708, the closest stable state is the high Q, low $\overline{Q}$ state. Thus, when the signal WL is brought high, the high Q, low $\overline{Q}$ state, labelled 710, will be reached, $\overline{Q}$ quickly falling to logic 0, shortly before Q reaches the logic 1 state.

Alternatively, if starting from the high Q, low $\overline{Q}$ state 710, a curve 712 of FIG. 7C will be followed, in which Q will initially fall very slowly as $\overline{Q}$ rises, until a corner 714 is reached when transistor 102 starts to turn on. Q then falls more quickly to a point 716 when $\overline{Q}$ is at Vmin, resulting from the relatively small voltage drop across resistance $R_{min}$ and transistor 104. In this example, the metastability point 707 has not been crossed, and from this point 716, the closest stable state is back to the high Q, low $\overline{Q}$ state. Thus, when the signal WL is brought high, Q will quickly return to the logic 1 state, before $\overline{Q}$ drops again to the logic 0 state.

In FIG. 7D, the same curves as 7C are shown, but for the transitions to a low Q, high $\overline{Q}$ state, corresponding to an opposite magnetic state of element 202 to the example of FIG. 7C. Thus the Vmax point 720 and Vmin point 722 are both closest to the low Q, high $\overline{Q}$ state.

As demonstrated by the curves of FIGS. 7C and 7D, irrespective of the initial states of the voltages Q and $\overline{Q}$, the new states of these voltage will be determined by the programmed resistance value of element 202.

Figure 8A:
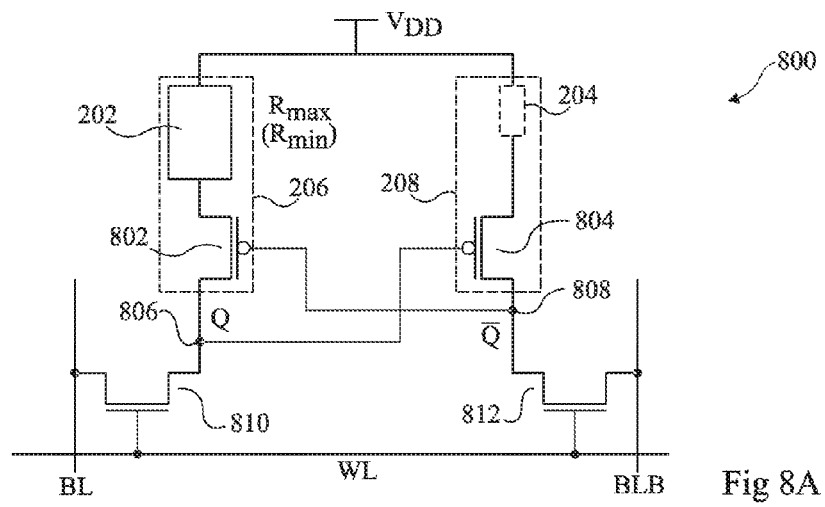
FIGS. 8A to 8C illustrate memory cells with non-volatile data storage according to further embodiments of the present invention.

FIG. 8A illustrates a memory cell 800, which is similar to cell 200 of FIG. 2, but in which the NMOS transistors 102, 104 are replaced by PMOS transistors 802 and 804 coupled between respective nodes 806, 808 and a supply voltage $V_{DD}$, and the PMOS transistors 110, 112 are replaced by NMOS transistors 810, 812 coupled between the respective bit lines BL and BLB and the respective nodes 806, 808. In this case, the threshold voltages of transistors 810 and 812 are lower than those of transistors 802 and 804, such that a leakage current will keep the state of the corresponding node 806 or 808 at a voltage value low enough to be seen as a logic low state during the standby phase between write operations. The resistance switching element 202 is coupled between the transistor 802 and the supply voltage $V_{DD}$, while optional resistor 204 is coupled between transistor 804 and the supply voltage. Furthermore, the bit lines BL and BLB are for example at least periodically brought to a low voltage during the standby phase.

The circuit 800 operates in a similar fashion to the circuit 200, except that transistors 810, 812 are activated by a high voltage level on the word line WL, and a low supply voltage, for example at 0 V, will be applied by circuitry 602 of FIG. 6 to the bit lines BL, BLB during the transfer phase from the non-volatile storage elements 202, 204 to the volatile storage nodes 806, 808, and by circuitry 312 of FIG. 3 to heat the resistance switching elements 202, 204.

Figure 8B:
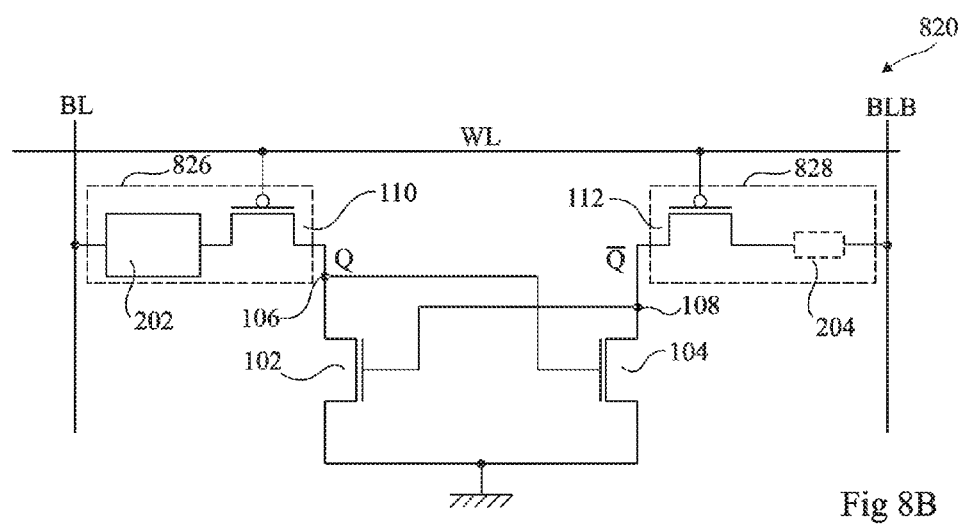

FIG. 8B illustrates a memory cell 820 similar to memory cell 200 of FIG. 2, except that the resistance switching element 202 is coupled between the PMOS transistor 110 and the bit line BL, while the optional resistor 204 is coupled between the PMOS transistor 112 and bit line BLB. A current branch 826 comprises transistor 110 and element 202, while a current branch 828 comprises transistor 112 and optionally resistor 204.

Operation of the circuit of FIG. 8B which is similar to that of FIG. 2, except that, during transfer of the non-volatile data stored by element 202 to the volatile storage nodes 106, 108, the resistance values $R_{max}$ and $R_{min}$ of element 202 will impose opposite states at nodes 106, 108 to those of the cell 200 of FIG. 2. In particular, when the resistance of element 202 is at $R_{max}$, the current through branch 826 will be relatively low, leading to a low voltage at node 106, and vice versa.

Figure 8C:
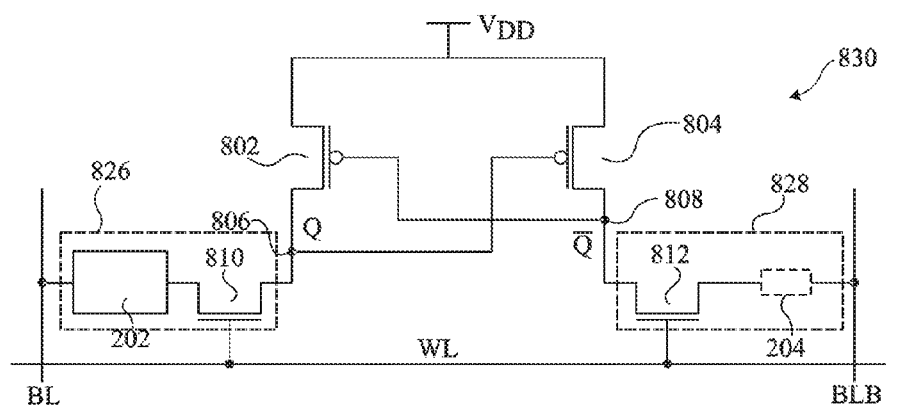

FIG. 8C illustrates a memory cell 830, which is similar to memory cell 800 of FIG. 8A, but in which the resistance switching element 202 is coupled between transistor 810 and bit line BL, while the resistor 204 is optionally coupled between transistor 812 and bit line BLB.

Figure 9:
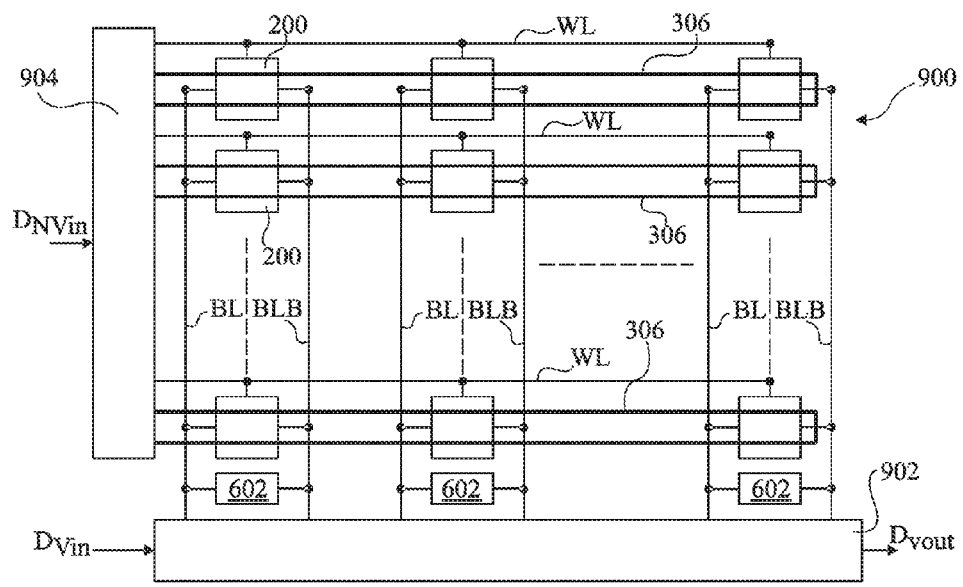
FIG. 9 illustrates a memory array according to an embodiment of the present invention.

FIG. 9 illustrates a memory array 900 of the memory cells 200, although the same array could alternatively comprise the memory cells 800, 820 or 830 of FIGS. 8A, 8B and 8C. In this example, the memory cells 200 are arranged in columns and rows, each being coupled to bit lines BL and BLB common to each of the columns. The bit lines are coupled to control circuitry 902, which for example receives volatile input data $D_{VIN}$, and volatile output data $D_{VOUT}$, which could be the externally inputted volatile data, or volatile data that is generated from a transfer of the non-volatile data stored by the resistance switching element. The circuitry 902 for example also controls the voltages on the bit lines BL and BLB during the transfer phase, and if appropriate during the writing of non-volatile data.

Each of the cells 200 is also coupled to a corresponding word line WL common to each row of cells, and a conductive track 306 forms a loop passing by each cell and conducting the current $I_{WRITE}$ for writing to the resistance switching element of each of the memory cells. Each of the lines WL and 306 is controlled by control circuitry 904, which receives input non-volatile data $D_{NVin}$, and provides the current $I_{WRITE}$ of the corresponding polarity.

The writing of the non-volatile data is for example performed row by row, in two phases. During a first phase, only the resistance switching element of cells for which a first logic value, such as logic "0", is to be programmed are heated. Then, when the corresponding write current is applied to the conductive track 306, the resistive states of only the elements that have been heated will be programmed. During the second phase, the resistance switching element of the other cells, for which the second logic value, for example a logic "1", is to be programmed are heated. Then, when the corresponding write current is applied to the conductive track 306, again only the resistive states of the elements that have been heated will be programmed.

As indicated by dashed lines in FIG. 9, the memory array 900 may comprise any number of rows of cells and any number of columns of cells, depending on the desired storage capacity.

The example of FIG. 9, in which a common track 306 is used for each row of memory cells, has the advantage of being efficient in terms of energy consumption. Indeed, a single current on each track 306 can be used to program multiple memory cells of the row.

As an alternative, a common track 306 could be used for each column, which has the advantage that a row of memory cells can all be programmed in a single programming cycle.

Furthermore, given that a current generator provides the current on each track 306, the number current generators would then be reduced to the number of columns rather than the number of rows of the memory.

Figures 10A, 10B:
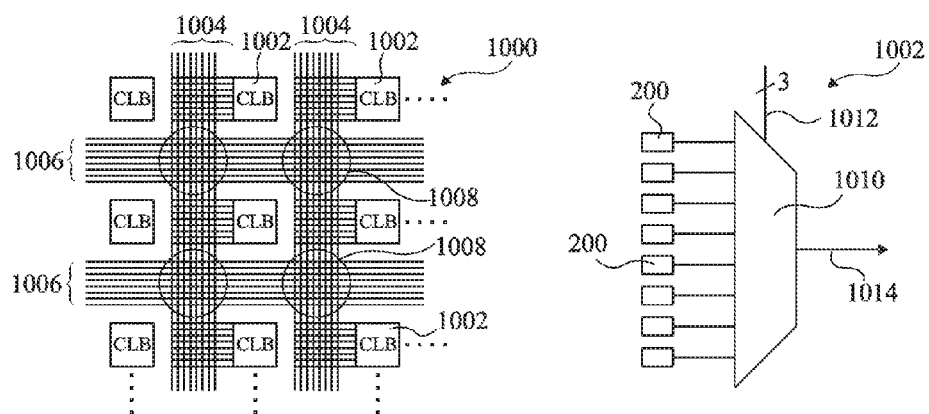
FIG. 10A illustrates a field programmable gate array (FPGA) according to an embodiment of the present invention.
FIG. 10B illustrates a configurable logic block of the FPGA of FIG. 10A in more detail according to an embodiment of the present invention.

FIG. 10A illustrates an FPGA (field programmable gate array) 1000 in which the memory cells 200, 800, 820 and/or 830 described herein may be incorporated. The FPGA comprises an array of configurable logic blocks (CLB) 1002 selectively interconnected by columns of lines 1004, which in turn are selectively interconnected with rows of lines 1006. In particular, switch blocks 1008 are provided at each intersection between column lines 1004 and row lines 1006, allowing the connections between the each of the column lines 1004 with each of the row lines 1006 to be programmed. The switching blocks 1008 for example comprise one or more of the memory cells 200, 800, 820 or 830, allowing the connections between the lines to be programmed in a non-volatile fashion.

FIG. 10B illustrates one of the CLB 1002 in more detail according to one example in which it comprises a look-up table formed of a multiplexer 1010 having 8 data inputs, each of which is coupled to memory cell 200 that outputs a data value from its volatile storage, i.e. one of the storage nodes 106, 108 or 806, 808. Alternatively, cell 200 could be replaced by the cell 800, 820 or 830.

In the particular application of FIG. 10B, the memory cell 200 is not coupled to bit lines of a memory array, such bit lines being coupled to multiple memory cells. Instead, they are more generally coupled to access lines, which could be bit lines, or lines coupled to just one memory cell. One of these access lines for example provides the output data value of the cell.

The multiplexer 1010 also comprises a 3-bit control input 1012, controlling which of the 8 input lines is selected, and an output line 1014, outputting the data of the selected input line.

An advantage of the embodiments of the memory cell described herein is that such a memory cell is capable of storing not only one bit of volatile data, but additionally one bit of non-volatile data. Furthermore, the non-volatile data storage is implemented using only a single resistance switching element, leading to a compact memory cell.

An advantage of the access line BL being connected via transistor 110 or 810 to storage node 106 and of the access line BLB being connected via transistor 112 or 812 to the storage node 108 is that the non-volatile data stored by element 202 may be transferred to the storage nodes 106, 108 by simply applying a voltage to the access lines BL, BLB and activating the transistors 110, 810, 112, 812. Such a transfer can be achieved with a typical supply voltage level, for example of 1.2 to 2 V, and with a relatively low ratio between the resistances $R_{min}$, $R_{max}$, for example of 2 or less. Furthermore, this feature permits data to be stored at the nodes 106, 108 independently of the programmed resistive state of element 202.

Furthermore, the programmed non-volatile data can be quickly loaded to the volatile portion of the memory cell in a simple fashion, by application of a voltage to the access lines of the memory cell. This advantageously means that a state programmed in a non-volatile fashion may be quickly loaded (in less than 1 ns), for example upon activation of the memory on power-up or after a sleep period. In the case of an FPGA, this allows a circuit design to be quickly initialised, without the need of loading external data into the device to program memory latches and switches.

According to embodiments described herein, the inverters forming the memory cell are each advantageously implemented by a single transistor, each coupled to the same supply voltage. Thus the memory cell is connected to only one power rail: ground in FIG. 2; and $V_{DD}$ in FIG. 8. The volatile data stored by the memory is maintained by current leakage passing through the access transistors of the memory cell, and this leads to very little static current consumption during a standby state in which the volatile data is to be maintained. Furthermore, this volatile data can be independent of the programmed state of the resistive switching element.

Furthermore, in the case that the volatile data in the memory is to be discarded during the standby state and only the non-volatile data is to be maintained, the power to the bit lines can be removed altogether, such that even the leakage current becomes negligible. The power consumption of the memory is thus extremely low during such a standby state.

Furthermore, advantageously the cell is capable of fast (in around 1 ns) write and read operations for the volatile storage portions, which may occur in a normal fashion irrespective of the programmed states of the non-volatile resistive elements. Furthermore, the write time for the non-volatile portion is also relatively fast (in around 35 ns in the case of an MRAM).

A further advantage of the memory cells described herein is that the non-volatile data may be read without the need of additional transistors in each memory cell.

Furthermore, the resistance switching element 202 of FIGS. 2, 8A, 8B and 8C are for example formed in a metal layer above a silicon layer in which the various transistors are formed. The positioning of element 202 connected directly to the ground voltage, supply voltage or bit lines is thus advantageous as a single via may be used from the silicon layer to one terminal of each resistance switching element, and the other terminal of each element can be connected directly to the corresponding supply rail or bit line rather than returning on another via to the silicon layer.

Having thus described at least one illustrative embodiment of the invention, various alterations, modifications and improvements will readily occur to those skilled in the art.

For example, it will be apparent to those skilled in the art that, while the invention has been described in relation to a memory array and FPGA, the memory cell described herein could be used in other types of memory devices, such as registers or flip-flops.

It will be apparent to those skilled in the art that the ground voltage described herein may be at 0 V, or more generally at any supply voltage $V_{SS}$, that could be different from 0 V.

Furthermore, it will be apparent to those skilled in the art that the variations in the threshold voltages between the transistors 102, 104 and the transistors 110, 112 of the four-transistor memory cell 200 of FIG. 2, or the corresponding transistors of the memory cells of FIGS. 8A, 8B and 8C, could be achieved in part by the selection of particular bulk voltages applied to each transistor.

Furthermore, while the various embodiments have been described in relation to MOS transistors, it will be apparent to those skilled in the art that the invention could be equally applied to other transistor technologies, such as bipolar transistors.

Furthermore, the features described in relation to the various embodiments could be combined in alternative embodiments in any combination.

The invention claimed is:

1. A memory device comprising at least one memory cell comprising:
    a first transistor coupled between a first storage node and a first supply voltage;
    a second transistor coupled between a second storage node and said first supply voltage, a control terminal of said first transistor being coupled to said second storage node, and a control terminal of said second transistor being coupled to said first storage node; and
    only one resistance switching element, wherein said only one resistive switching element is coupled in series with said first transistor and is programmable to have one of first and second resistances, wherein said first storage node is coupled to a first access line via a third transistor, and said second storage node is coupled to a second access line via a fourth transistor,
    wherein said at least one memory cell comprises a first branch and a second branch, the first branch comprising said only one resistance switching element and said first transistor, and the second branch comprising said second transistor, and
    wherein said second branch is adapted to have, when said transistor of said second branch is activated, a resistance $R_2$ such that:

$$R_{ON1}+R_{min}<R_2<R_{ON1}+R_{max},$$

where $R_{ON1}$ is the ON resistance of said transistor of said first branch, and $R_{min}$ and $R_{max}$ are said first and second resistances respectively.

2. The memory device of claim 1, wherein said only one resistance switching element is coupled between said first transistor and said first supply voltage.

3. The memory device of claim 1, wherein said transistor of said second branch is adapted to have a different ON resistance from said transistor of said first branch.

4. The memory device of claim 1, wherein said second branch comprises a fixed value resistor coupled in series with said transistor of said second branch.

5. The memory device of claim 2, wherein said memory cell further comprises control circuitry adapted to store a data value at said first and second storage nodes by coupling said first and second storage nodes to a second supply voltage, and isolating said first and second storage nodes from said first supply voltage after a time delay, the data value being determined by the relative resistances of the first and second branches.

6. The memory device of claim 1, wherein said only one resistance switching element is coupled between said third transistor and said first access line, a first branch of said memory cell comprising said element and said third transistor, and a second branch of said memory cell comprising said fourth transistor.

7. The memory device of claim 6, wherein said third and fourth transistors are adapted to have a lower threshold voltage than said first and second transistors.

8. The memory device of claim 1, wherein said second branch is adapted to have a resistance $R_2$ such that:

$$R_2 = R_{ON1} + (R_{min} + R_{max})/2.$$

9. The memory device of claim 1, wherein said only one resistance switching element is one of:
an oxide resistive element;
a conductive bridging element;
a phase change element;
a programmable metallization element;
a spin-torque-transfer element; and
a field-induced magnetic switching element.

10. A memory device comprising at least one memory cell comprising:
a first transistor coupled between a first storage node and a first supply voltage;
a second transistor coupled between a second storage node and said first supply voltage, a control terminal of said first transistor being coupled to said second storage node, and a control terminal of said second transistor being coupled to said first storage node; and
only one resistance switching element, wherein said only one resistive switching element is coupled in series with said first transistor and is programmable to have one of first and second resistances, wherein said first storage node is coupled to a first access line via a third transistor, and said second storage node is coupled to a second access line via a fourth transistor, wherein said only one resistance switching element is a thermally assisted switching element, and wherein said at least one memory cells further comprises a single transistor controllable to heat said only one resistance switching element by passing a current through it.

11. The memory device of claim 1, wherein said first transistor is the only transistor of a first inverter of said at least one memory cell, and said second transistor is the only transistor of a second inverter of said at least one memory cell.

12. A random access memory comprising:
an array of memory devices each of the memory devices comprising at least one memory cell comprising:
a first transistor coupled between a first storage node and a first supply voltage;
a second transistor coupled between a second storage node and said first supply voltage, a control terminal of said first transistor being coupled to said second storage node, and a control terminal of said second transistor being coupled to said first storage node; and
only one resistance switching element, wherein said only one resistive switching element is coupled in series with said first transistor and is programmable to have one of first and second resistances, wherein said first storage node is coupled to a first access line via a third transistor, and said second storage node is coupled to a second access line via a fourth transistor,
wherein said at least one memory cell comprises a first branch and a second branch, the first branch comprising said only one resistance switching element and said first transistor, and the second branch comprising said second transistor, and
wherein said second branch is adapted to have, when said transistor of said second branch is activated, a resistance $R_2$ such that:

$$R_{ON1} + R_{min} < R_2 < R_{ON1} + R_{max},$$

where $R_{ON1}$ is the ON resistance of said transistor of said first branch, and $R_{min}$ and $R_{max}$ are said first and second resistances respectively.

13. A field programmable gate array comprising:
at least one multiplexer comprising an input coupled to at least one memory device, the at least one the memory device comprising at least one memory cell comprising:
a first transistor coupled between a first storage node and a first supply voltage;
a second transistor coupled between a second storage node and said first supply voltage, a control terminal of said first transistor being coupled to said second storage node, and a control terminal of said second transistor being coupled to said first storage node; and
only one resistance switching element, wherein said only one resistive switching element is coupled in series with said first transistor and is programmable to have one of first and second resistances, wherein said first storage node is coupled to a first access line via a third transistor, and said second storage node is coupled to a second access line via a fourth transistor,
wherein said at least one memory cell comprises a first branch and a second branch, the first branch comprising said only one resistance switching element and said first transistor, and the second branch comprising said second transistor, and
wherein said second branch is adapted to have, when said transistor of said second branch is activated, a resistance $R_2$ such that:

$$R_{ON1} + R_{min} < R_2 < R_{ON1} + R_{max},$$

where $R_{ON1}$ is the ON resistance of said transistor of said first branch, and $R_{min}$ and $R_{max}$ are said first and second resistances respectively.

14. A field programmable gate array comprising:
a plurality of configurable logic blocks; and
at least one switching block adapted to interconnect said plurality of configurable logic blocks, wherein said at least one switching block comprises a memory device comprising at least one memory cell comprising:
a first transistor coupled between a first storage node and a first supply voltage;
a second transistor coupled between a second storage node and said first supply voltage, a control terminal of said first transistor being coupled to said second storage node, and a control terminal of said second transistor being coupled to said first storage node; and only one resistance switching element, wherein said only one resistive switching element is coupled in series with said first transistor and is programmable to have one of first and second resistances, wherein said first storage node is coupled to a first access line via a third transistor, and said second storage node is coupled to a second access line via a fourth transistor, wherein said at least one memory cell comprises a first branch and a second branch, the first branch comprising said only one resistance switching element and said first transistor, and the second branch comprising said second transistor, and wherein said second branch is adapted to have, when said transistor of said second branch is activated, a resistance $R_2$ such that:

$$R_{ON1}+R_{min}<R_2<R_{ON1}+R_{max},$$

where $R_{N1}$ is the ON resistance of said transistor of said first branch, and $R_{min}$ and $R_{max}$ are said first and second resistances respectively.

15. A method of transferring a data value from non-volatile storage of a memory device to first and second volatile storage nodes of said memory device, the memory device comprising at least one memory cell comprising a first transistor coupled between a first storage node and a first supply voltage, a second transistor coupled between a second storage node and said first supply voltage, a control terminal of said first transistor being coupled to said second storage node, and a control terminal of said second transistor being coupled to said first storage node, and only one resistance switching element, wherein said only one resistive switching element is coupled in series with said first transistor and is programmable to have one of first and second resistances, wherein said first storage node is coupled to a first access line via a third transistor, and said second storage node is coupled to a second access line via a fourth transistor, said only one resistance switching element coupled between said first transistor and said first supply voltage, a first branch of said at least one memory cell comprising said only one resistance element and said first transistor, and a second branch of said at least one memory cell comprising said second transistor, wherein said second branch is adapted to have, when said transistor of said second branch is activated, a resistance $R_2$ such that:

$$R_{ON1}+R_{min}<R_2<R_{ON1}+R_{max},$$

where $R_{ON1}$ is the ON resistance of said transistor of said first branch, and $R_{min}$ and $R_{max}$ are said first and second resistances respectively, the method comprising:

coupling said first and second storage nodes to a first supply voltage, the data value being determined by the relative resistances of the first and second branches.

* * * * *